United States Patent
Lawrence et al.

(10) Patent No.: US 9,413,076 B2
(45) Date of Patent: Aug. 9, 2016

(54) ELECTROMAGNETIC RADIATION ABSORBER

(75) Inventors: Christopher Robert Lawrence, Malvern (GB); Matthew J. Lockyear, Malvern (GB); Peter Allen Hobson, Malvern (GB); Alastair Paul Hibbins, Malvern (GB); John Roy Sambles, Malvern (GB)

(73) Assignee: QINETIQ LIMITED (GB)

( * ) Notice: Subject to any disclaimer, the term of this patent is extended or adjusted under 35 U.S.C. 154(b) by 206 days.

(21) Appl. No.: 14/234,585

(22) PCT Filed: Jul. 23, 2012

(86) PCT No.: PCT/GB2012/000606
§ 371 (c)(1),
(2), (4) Date: Jan. 23, 2014

(87) PCT Pub. No.: WO2013/014406
PCT Pub. Date: Jan. 31, 2013

(65) Prior Publication Data
US 2014/0240159 A1  Aug. 28, 2014

(30) Foreign Application Priority Data
Jul. 25, 2011 (GB) .................... 1112740.4

(51) Int. Cl.
*H01Q 17/00* (2006.01)
*H01Q 15/00* (2006.01)
(Continued)

(52) U.S. Cl.
CPC ............ *H01Q 17/00* (2013.01); *H01Q 9/0414* (2013.01); *H01Q 15/00* (2013.01); *H01Q 15/0013* (2013.01); *H01Q 15/0026* (2013.01); *H01Q 17/002* (2013.01); *H01Q 17/008* (2013.01); *H05K 9/0086* (2013.01); *H05K 9/0088* (2013.01); *Y10T 29/4902* (2015.01)

(58) Field of Classification Search
CPC ......................................... H01Q 17/00–17/008
USPC ........................................................ 342/1–4
See application file for complete search history.

(56) References Cited

U.S. PATENT DOCUMENTS

| | | | |
|---|---|---|---|
| 2,599,944 A | | 6/1952 | Salisbury |
| 2,951,247 A | * | 8/1960 | Halpern ............... H01Q 17/002 101/389.1 |

(Continued)

FOREIGN PATENT DOCUMENTS

| | | |
|---|---|---|
| EP | 0323826 | 7/1989 |
| EP | 1796450 | 6/2007 |

(Continued)

*Primary Examiner* — Peter Bythrow
(74) *Attorney, Agent, or Firm* — McDonnell Boehnen Hulbert & Berghoff LLP (57) ABSTRACT

A radiation absorber comprising multiple layers has a conducting base layer, and at least first and second further layers, each separated by a dielectric material, the first and second layers having patches thereon of highly conducting material, and defining resonant cavities in cooperation with the dielectric material, wherein the resonant cavities formed on adjacent layers differ in frequency. Characteristics of the patch, such as size or shape may vary on each layer to provide different resonant frequencies, and/or dielectric or magnetic properties of the dielectric material, and/or separation distance of the patches may be varied. In some embodiments, complex dielectrics may have their loss factors adapted to tune a resonant frequency, or to adapt its resonant bandwidth.

13 Claims, 5 Drawing Sheets

(51) Int. Cl.
 *H05K 9/00* (2006.01)
 *H01Q 9/04* (2006.01)

(56) References Cited

U.S. PATENT DOCUMENTS

| | | | |
|---|---|---|---|
| 3,540,047 A | 11/1970 | Walser | |
| 3,887,920 A * | 6/1975 | Wright | H01Q 17/00 342/1 |
| 5,081,455 A * | 1/1992 | Inui | H01Q 17/002 342/1 |
| 5,148,172 A * | 9/1992 | Kumurdjian | C09D 5/32 342/1 |
| 5,214,432 A * | 5/1993 | Kasevich | H01Q 15/0026 342/3 |
| 5,223,849 A * | 6/1993 | Kasevich | H01Q 15/0026 343/895 |
| 5,325,094 A * | 6/1994 | Broderick | H01Q 15/0026 342/1 |
| 5,576,710 A * | 11/1996 | Broderick | H01Q 15/0013 342/1 |
| 5,627,541 A * | 5/1997 | Haley | H01Q 17/00 342/1 |
| 6,224,982 B1 | 5/2001 | Woldanski | |
| 6,225,939 B1 * | 5/2001 | Lind | H01Q 1/38 342/1 |
| 6,441,771 B1 | 8/2002 | Victora | |
| 6,448,936 B2 * | 9/2002 | Kopf | H01Q 13/10 343/767 |
| 6,483,481 B1 * | 11/2002 | Sievenpiper | H01Q 15/008 343/700 MS |
| 6,538,596 B1 * | 3/2003 | Gilbert | F41H 3/00 342/1 |
| 6,756,932 B1 * | 6/2004 | Barker | H01Q 17/00 342/1 |
| 7,420,500 B2 * | 9/2008 | Treen | H01Q 17/00 219/678 |
| 7,804,439 B2 * | 9/2010 | Yoshida | H01Q 17/002 342/1 |
| 7,834,799 B1 | 11/2010 | Wells | |
| 8,212,739 B2 * | 7/2012 | Sievenpiper | H01Q 1/288 343/700 MS |
| 8,514,036 B2 * | 8/2013 | McKinzie, III | H01P 1/16 333/175 |
| 2004/0214496 A1 | 10/2004 | Yang | |
| 2004/0234750 A1 | 11/2004 | Yen et al. | |
| 2004/0263420 A1 * | 12/2004 | Werner | H01Q 1/38 343/909 |
| 2010/0089637 A1 | 4/2010 | Lin et al. | |

FOREIGN PATENT DOCUMENTS

| | | |
|---|---|---|
| EP | 2362488 | 8/2011 |
| GB | 2062358 | 5/1981 |
| GB | 2240661 | 8/1991 |
| GB | 2404087 | 1/2006 |
| JP | 2006-128664 | 5/2006 |
| JP | 2007-027668 | 2/2007 |
| WO | WO 93/05960 | 4/1993 |
| WO | WO 93/23893 | 11/1993 |
| WO | WO 2009/128467 | 10/2009 |

* cited by examiner

ELECTROMAGNETIC RADIATION ABSORBER

FIELD OF THE INVENTION

This invention relates to electromagnetic radiation absorption or attenuation, and methods and devices therefore.

BACKGROUND OF THE INVENTION

Electromagnetic radiation absorbing materials (RAMs) are useful in a range of applications. For example, they can be used as wall coatings to screen electromagnetic signals in the mobile communications or WIFI bands. They can also be used to reduce interference from wind turbines, electricity pylons, and other large metal structures, as well as being used to shield sensitive medical equipment, or sensors and wires attached to the body during magnetic resonance imaging.

At airports, surveillance radar signals reflect from airport buildings resulting in stray secondary radar emissions. To reduce these secondary emissions some airport buildings (e.g. the World Cargo Centre at Heathrow Airport, UK) are covered in radar absorbing materials.

A further use of RAMs is in the automotive industry. Current and future car designs often now include a car based radar system for aiding parking manoeuvres and monitoring car separation distances whilst en route (i.e. collision warning systems). Generally, only straight line returns from the car in front/behind are desired and so absorbent coatings may be used to cut down on spurious reflections.

Common radiation absorbing systems include Jaumann type absorbers and Salisbury screens (see U.S. Pat. No. 2,599,944), and Dallenbach type absorbers such as magnetic paint based arrangements. These types of absorbers have tended to be thick and/or heavy and have been difficult to apply or implement without adversely affecting the surface or structure to which they are applied.

Hybrid designs may take advantage of a combination of these techniques and hence, provide wider bandwidths for a reasonable thickness. However, problems in bonding, complexity in production and maintenance, and high cost are typical of such designs.

Applicant's WO 2005/013663 describes a radiation absorbing structure comprising a patterned conductor layer separated from a conducting back plane which can be less than, typically far less than, a quarter of the wavelength of absorbed radiation in thickness. This structure is particularly useful for RFID screening. However, in order to be effective for this purpose, the absorption peak should be closely aligned to the central frequency band of interest (commonly 866 MHz). This places constraints on manufacturing tolerances (physical dimensions, material permittivity values etc) or equivalently, small errors in manufacturing can lead to loss of performance.

European Patent application EP0323826 describes a multiple layered absorbing structure having a low loss, with a plurality of high loss strips running therethrough. This uses the high loss strips to absorb incident radiation of an appropriate frequency.

SUMMARY OF THE INVENTION

It is an object of the present invention to provide improved, and alternative methods and apparatus for radiation absorption.

According to a first aspect of the invention there is provided an electromagnetic radiation absorber comprising a conducting base layer, a plurality of further layers, including at least a first and a second layer, and all separated from each other with dielectric material; the first layer including a first array of conducting patches, the second layer including a second array of conducting patches, said base layer, first layer and second layer being spaced apart from, and electrically isolated from one another, wherein patches of said second layer are stacked on top of patches of said first layer characterised in that each patch is highly conductive, and defines a resonant cavity in cooperation with one or more conductive patches, or the conductive base layer, below it, and the dielectric material therebetween, and wherein a resonant frequency of the cavity is different from a resonant frequency of an adjacent cavity above or below it.

In this way there is provided a laminar structure having an array of multilayer elements, each comprising a stack of conducting patches. The term "patches" is used to refer to individually distinct, thin planar areas of material which can be defined and arranged in a desired configuration. Conducting "islands" is sometimes used as an equivalent term.

As will be explained in more detail, and with reference to some example geometries, a resonant cavity is formed in the regions between the layers which are bounded by conductor, i.e. in a dielectric region between patches of the first layer and the base layer, and in between patches of the first and second layers. Likewise, for subsequent layers, the cavity is generally defined by patches on adjacent layers.

Typically, but not necessarily, the patches are arranged with patches on the second and any subsequent layers being positioned directly above those of the first layer, such that they share a common axis.

Typically, but not necessarily, patches of the second array are smaller than patches of first array, and any subsequent layers have patches smaller in area than those below them, leading to a tapering stacked structure. The resonant frequency of the cavity is generally determined by the smaller patch acting to define it, and hence, in this way, the resonant cavity will be defined by the upper patch of the cavity, the edges of which typically lies within or aligned with the edges of the lower patch and/or ground plane.

Alternatively, patches on the second, and subsequent layers, may be larger than those directly below them.

In preferred embodiments, each cavity acts as an individual resonator. The geometry of the cavity, and hence the size of the upper bounding metallic patch determines a resonant mode which is supported, which in turn determines (at least in part) the frequency of absorption.

By arranging for the resonant frequency of cavities or patches in different layers to be different, and by tuning the layers such that a group of adjacent frequency bands are addressed, broadening of an absorption peak can be provided. This offers the advantage that when designing for absorption at a particular frequency, greater manufacturing errors can be tolerated.

Patch geometry, e.g. size and shape and refractive index of the cavity material are preferred parameters for tuning the resonant frequency. Patch separation, and hence cavity thickness can also be varied to provide a retuning of individual resonances, although this is a less sensitive parameter that is more influential upon the maximum absorption value than the resonant frequency. Therefore, a structure will typically be designed in which one or more of these parameters varies between layers.

Conducting patches in at least one array are regularly spaced in certain embodiments. This may be square spacing or hexagonal spacing, for example. Alternatively, a random array may prove useful in applications. In some embodiments it will be desirable to achieve a high packing density of patches, and therefore patch separation or spacing will be minimised. In other embodiments, however, patch separation of the order of a quarter of, a half of, or even of the order of or greater than the patch diameter or external dimension is feasible.

As explained above, patches should overlie one another to form stacks, and therefore the periodicity or spacing of each array is preferably the same. It should be noted though that for tapering stacks, patches in different layers need not have centres aligned, and some degree of offset or eccentricity can be tolerated in examples.

The width or external dimensions of the patches depends upon the particular application or end use of the electromagnetic radiation absorber (especially the operating frequency), and on other factors such as the particular dielectric material or materials used to electrically isolate the respective layers and/or the geometry of the patches. In one example, an absorber for a UHF RFID application operating at around 0.866 GHz comprises circular patches of about 100 mm diameter at a pitch of around 130 mm. Although the pitch or separation of adjacent patches in an array can be varied, as discussed in greater detail below, it is envisaged that embodiments of the invention including arrays of more than five or more than ten patches or stacks of patches might find use in certain applications, but it is more likely that arrays of 25, 50 or 100 elements or more will be desirable where larger surfaces are to be covered.

Each patch in an array is preferably in the shape of a regular polygon, for example a square or hexagon. In a particularly preferred embodiment, however, patches are circular. In such an embodiment, a response that tends to be independent of incident ($\theta$) and azimuth ($\phi$) angle of the impinging radiation can be achieved.

It is also noted that embodiments of the invention allow different layers to be optimised to respond to different polarisation states, which in turn allows the overall polarisation response of the structure to be manipulated. For example, the first layer can be optimised to respond to TM (p) polarised radiation, and the second layer can be optimised to respond to TE (s) polarised radiation, providing a structure which maintains absorption and suffers less frequency narrowing at higher angles of incidence, for both TM and TE. Examples of parameters which can be adjusted to optimise response to different polarisation states include patch dimension (e.g. length and width for rectangular patches), patch separation in layer, and dielectric thickness.

Embodiments of the structure offer highly efficient absorption of incident radiation over a broadened bandwidth, when compared with a single layer structure or stack.

The structure may also provide an improved response in terms of polarisation independence. In addition, despite having a plurality of layers, the structure can be made extremely thin in comparison to the operating wavelength. For example, structures less than $\lambda_0/10$ in thickness can be achieved where $\lambda_0$ is the central frequency of absorption. For example, for a central operating frequency of 16.5 GHz ($\lambda_0$=18.2 mm) and a bandwidth of 6 GHz, a structure having a thickness of 0.9 mm can be produced.

Conductor layers or patches are spaced apart by a solid dielectric material in certain embodiments, such as a polymer film or layer such as polyester. Paper can also be used. However, it is not a requirement that the dielectric is a continuous or uniform solid and the dielectric may contain air gaps or particulate inclusions, for example. Moreover, different patch/dielectric layers may comprise different dielectric materials (having different refractive indices).

The conductive patches are preferably formed from copper, aluminium, silver or other highly conductive, and easily processed metals. The patches may be applied in any suitable manner, such as by etching a fully coated surface, or by using sticky back foils, or any other standard technique such as electroless deposition. Alternatively, the conductive patches may be formed from colloidal inks, such as those from Novacentrix®, that incorporate metal particles at a high volume fraction in an ink. The inks may be printed using known techniques, e.g. screen printing, litho, or ink jet printing. Such inks have been utilised in 0.1 mm thick layers, and have conductivities approaching those of pure metals.

Alternatively, the patch may be made from other materials, such as Indium tin oxide, or a wire mesh with a mesh fine enough for it to be seen as effectively a continuous plane at the wavelength of interest. Such a mesh may have holes no larger than approximately lambda/10, where lambda is the shortest wavelength of interest. The patches are advantageously homogeneous (or effectively homogeneous at the frequency of interest in the case of a wire mesh) and of uniform thickness.

It should be noted that the patches of the present invention are not absorbers of EM radiation, but are conductive metallic patches, which enables them to form resonant cavities within the dielectric material. Preferred materials for the patches include copper, or other highly conductive, easily processed metals such as aluminium. Each patch preferably comprises a continuous, homogeneous conductor, of uniform thickness.

In an embodiment where the surface comprises a metal-dielectric composite, with each metal layer only about 18 microns thick, this thin absorber can be flexible, and yet robust. In addition to standard print and etch techniques, manufacturing processes such as the use of aluminised dielectric films or thin layer laminates allow for metal patch thicknesses on the order of the skin depth (0.6 microns). As such, the absorber may be applied to singly curved surfaces, and may also be coated with a concealing, or weatherproofing, layer of paint or other coatings, without a loss in absorption efficiency or operating bandwidth. The structure can also be manufactured at low cost, constructed using standard circuit board manufacturing techniques for example.

Embodiments of the invention may further comprise a third layer including a third array of conducting patches, spaced apart from and electrically isolated from said second layer.

Additional layers, and hence patches per stack, can be added to increase the absorption band further, and structures having three or more, five or more, or even ten or more layers are envisaged.

The above aspect of the invention provides for a conducting base layer and multiple additional layers containing conducting patches. However, in cases where the material is to be applied to a metallic surface (e.g. a car) then the conducting base layer can be dispensed with since the metal structure itself can be used as the base layer. In this way, once the first layer is arranged on the metallic surface, and maintained at an appropriate distance therefrom, then the remaining structure can remain unchanged, and operate in the intended fashion.

Properties of the dielectric materials may vary from layer to layer in certain embodiments, or alternatively may be kept constant in others. Advantageously, the complex permittivity or permeability of the dielectric material may be varied, in one or more of the layers, to vary the absorption properties of the absorber. More advantageously, the loss factor (i.e. the imaginary part of the complex permittivity) may be varied to this end. This may be varied by, e.g. adding different materials or voids to the dielectric According to a further aspect of the invention then, there is provided a method of treating a conducting surface to reduce electromagnetic radiation reflection, or conversely treating a conducting surface to impart electromagnetic radiation absorption, said method comprising:

providing one or more multilayer elements, each element comprising a first highly conducting layer and a second highly conducting layer overlying the first layer, said second layer spaced apart from and electrically isolated from said first layer with a dielectric material; and applying said one or more multilayer elements to said conducting surface such that said first layer is spaced apart from and electrically isolated from said conducting surface, wherein each multilayer element comprises a metallic patch, and in use defines a resonant cavity in cooperation with one or more conductive patches, or the conductive surface, below it, and the dielectric material therebetween, and wherein a resonant frequency of the cavity is different from a resonant frequency of an adjacent cavity above or below it.

The invention extends to methods, apparatus and/or use substantially as herein described with reference to the accompanying drawings.

Any feature in one aspect of the invention may be applied to other aspects of the invention, in any appropriate combination. In particular, method aspects may be applied to apparatus aspects, and vice versa.

DESCRIPTION OF THE DRAWINGS

Preferred features of the present invention will now be described, purely by way of example, with reference to the accompanying drawings, in which.

DESCRIPTION OF THE INVENTION

Figure 1:
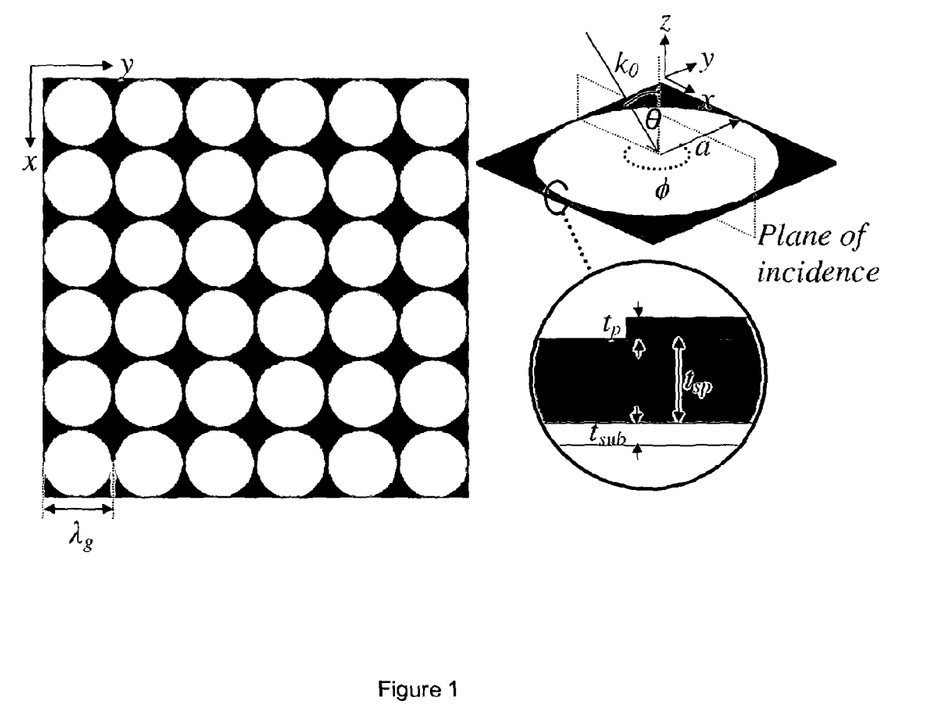
FIG. 1 shows the basic geometry of a single thickness array of patches.

Referring to FIG. 1, there is shown a basic structure comprising a single layer of circular copper patches of thickness $t_p$=18 μm and radius a=3 mm arranged to form a 500 mm×500 mm square array of pitch $\lambda_9$ 6.2 mm. In such an arrangement an array of over 6000 patches are present. The patches are separated from a copper ground plane by a dielectric spacer (polyester sheet with dielectric constant $\in$=3.2+0.01i) of thickness $t_{sp}$=100 μm, thus providing an overall sample thickness of 136 μm, compared to an incident wavelength $\lambda_0$ in the range 4 mm<$\lambda_0$<25 mm. The sample was mounted upon a rotating turntable allowing data to be obtained over a full range of azimuthal angles φ for discrete angles of incidence θ, as indicated in FIG. 1.

Figure 2:
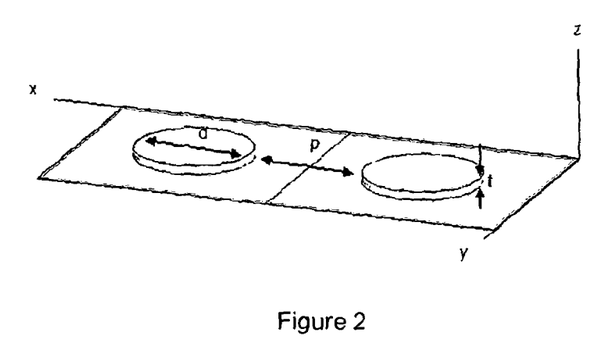
FIG. 2 is a perspective view of 2 patches.

Such a structure contains a single layer of planar circular cavities (shown more clearly in perspective in FIG. 2). Within the region of the dielectric that is bounded by metal (either between two patches in subsequent layers or between the patch and the ground plane) exists a high quality factor (Q factor) resonant cavity. This cavity supports a resonant mode determined by the geometry of the upper bounding metallic patch. The resonant mode supported has been found to be analogous to the modes of an infinitely long metal clad waveguide of the same geometry as the bounding. This is counter-intuitive on first inspection, but with further investigation it is noted that the EM boundary conditions of the thin disc cavity are the inverse (i.e. the roles of the magnetic and electric fields are reversed) of those of a truncated metal-clad waveguide of circular cross section. Specifically, the electrically conducting cylindrical walls of a waveguide become 'magnetic' boundary conditions on resonance of the waveguide mode of the disc cavity. Conversely, the two open ends of a waveguide, which act as 'magnetic mirrors' on resonance, are replaced by the metal patches 'electric mirrors' in the present geometry (if we consider the ground plane to produce an "image" patch $2t_{sp}$ below the real patch).

Figure 3:
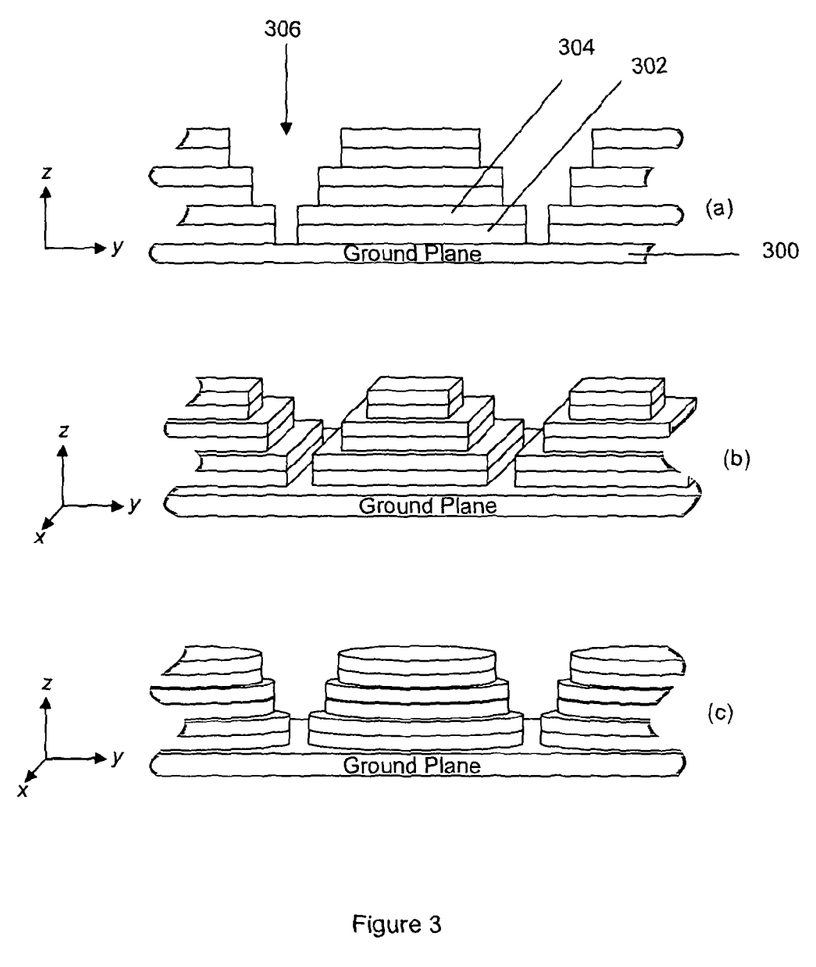
FIG. 3 shows a number of multilayer patch geometries.
Figure 5:
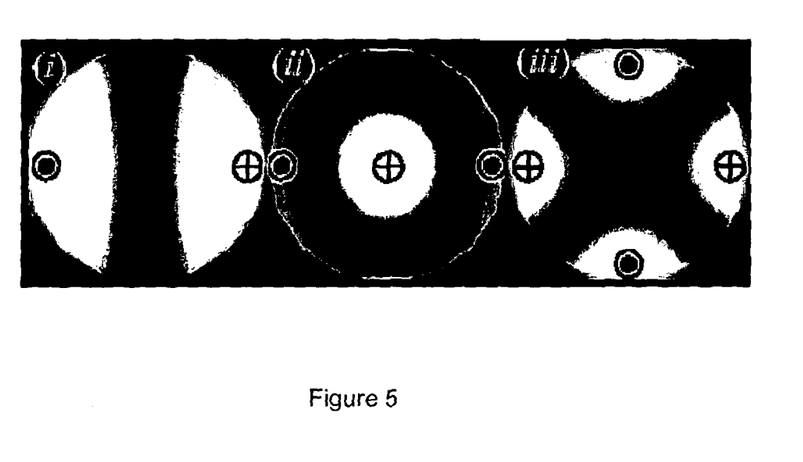
FIG. 5 shows resonant modes for a circular patch or cavity.

Considering now the multi-layered structures of FIG. 3, FIG. 3 (*a*) shows stacked slats considered infinite into and out of the page. The geometry shown in FIG. 3 (*a*) supports modes quantised in the x direction only (the width of each slat). FIG. 3 (*b*) is an array of stacked square patches. The square geometry of FIG. 3 (*b*) supports modes quantised in both the x and y directions, as does a square waveguide. FIG. 3 (*c*) is an array of stacked circular patches. The circular patch of FIG. 3 (*c*) supports modes quantised both around the circumference of the patch, and also in the radial direction. For the purpose of further discussion, we now restrict ourselves to consideration of the circular patch geometry as proof of principle. The resonant fields pertaining to the first three modes of oscillation for this geometry are shown in FIG. 5 (i) (ii) and (iii). Field strengths are calculated at θ=26.25° and φ=0° and evaluated over a plane parallel to the surface plane of the array and positioned midway between the disk and ground plane. The direction of the electric-field vector at a point in phase corresponding to maximum field enhancement is also indicated (the cross indicating that the vector is entering the page, whereas the dot is exiting from it).

Example configurations comprise a multi layered dielectric, typically—but not limited to—ten layers. The thickness of each layer is typically in the range 0.5 mm to 4 mm for a UHF RFID application, the precise thickness depending on the refractive index of the material (in general, a lower refractive index enables a thinner layer). Examples are about 3 mm for polyester, or about 1 mm for polyethylene. The first dielectric layer 302 is situated on a continuous metal ground plane 300, which may be replaced by the surface of any metal object requiring concealment. Each dielectric layer has, on its top surface, an array of metallic patches e.g. layer 304 (of typical thickness 18 microns, although less than 1 micron will suffice).

In FIG. 3, each stack is shown separated from the next, i.e. the layers are discontinuous. Dielectric layers may, however, be continuous, extending throughout the plane of the structure in the spaces indicated as 306 in the Figure. The individual patches in the conductor layers must be separated, and because the conductor layers are typically much thinner than the dielectric layers (although their thickness has been exaggerated for the purpose of the figures) a filler material is not typically necessary in areas between stacks.

Figure 4:
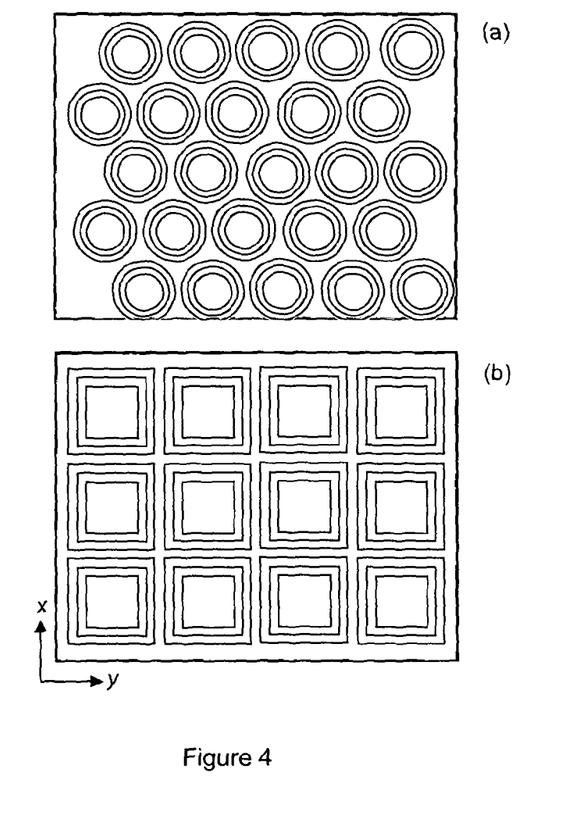
FIG. 4 is a plan view of an array of multilayer elements showing different stack spacing.

An example of circular patches in a hexagonal array are shown in plan view in FIG. 4(*a*) and square patches in a square array arrangement are shown in 4(*b*).

In preferred embodiments, each patch acts as an individual resonator, with a resonant frequency dictated by the geometry of the upper patch. For circular patches the resonant frequency of the fundamental mode is given by $$\nu_{cutoff} = \frac{p'_{mn} c}{2\pi a n} \quad (1)$$

where c is the speed of light, a the radius of the disk and n the refractive index of the dielectric spacer. Here the factor $p'_{mn}$ is the $m^{th}$ root of a $n^{th}$ order Bessel function $J'_n$, which must be solved numerically to define the cut-off frequencies pertaining to circular geometries (note that equation 1 also describes the resonant frequencies of a circular waveguide. All waveguide geometries may be considered in a similar manner). For the fundamental and second harmonic modes shown in FIG. 5 (i) and (ii), which we will label as the $TM_{11}$ and the $TM_{21}$, the values for $p'_{mn}$, are 1.841 and 3.054, respectively. Hence in the circular case, and since the z-dimension of the cavity is much less than $\lambda/4$ (no quantization in the z direction), the resonant frequency is defined by the radius of the patch. At this resonant frequency, high fields within the cavity result in power loss via Joule heating, and the resonance manifests itself as a deep minimum in the specular reflection from the sample.

Since the resonant frequency of the mode is determined primarily by either the radius of the patch or refractive index of the dielectric spacer, either n or r is varied in subsequent layers throughout the sample. As noted above, dielectric thickness and hence patch separation may also be adjusted. Adjusting the difference in radii for successive patches in the stack results in multiple reflectivity minima in the specular reflection. Fine tuning of patch geometry then allows the modes to be brought together in frequency, resulting in a merged absorption response from the sample as will be explained with reference to FIGS. 6 to 8.

Figure 6:
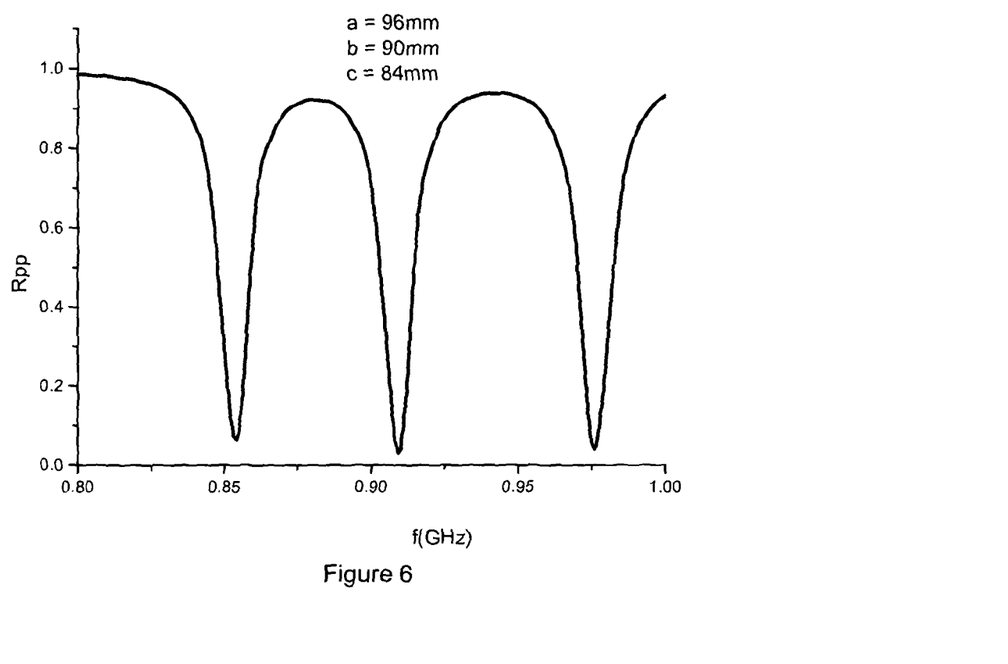
FIGS. 6 and 7 illustrate reflectivity response for an array of multilayer stacks.

FIG. 6 shows the absorption results of a structure built up from an infinite copper ground plane 17 micron thick. A layer of polyester ($\in=3.2+0.0096i$), 0.8 mm thick overlies the ground plane, and a penny patch of side length a=96 mm in a square array of pitch 130 mm overlies the polyester layer. A second 0.8 mm layer of polyester is added on top of the first, and over the top of the first patch. A second patch of side length b=90 mm in the same square array of pitch 130 mm is also added. Finally, a further polyester layer and an additional patch are added forming a 3 stack comprising of a copper ground plane and 3 patches (the third patch with a side length of c=84 mm) in a vertical stack, each separated from the other by 0.8 mm of polyester. The 3 corresponding resonances correspond to the fundamental TE11 mode and are clearly visible in the specular reflection, each one occurring to first approximation at the frequency dictated by the corresponding patch geometry. To summarise, each separate reflectivity minimum seen in the specular reflection is due to a single layer of the resonant patch cavities, the largest patch array being the lowest frequency mode, centred at approximately 855 MHz in this example.

Figure 7:
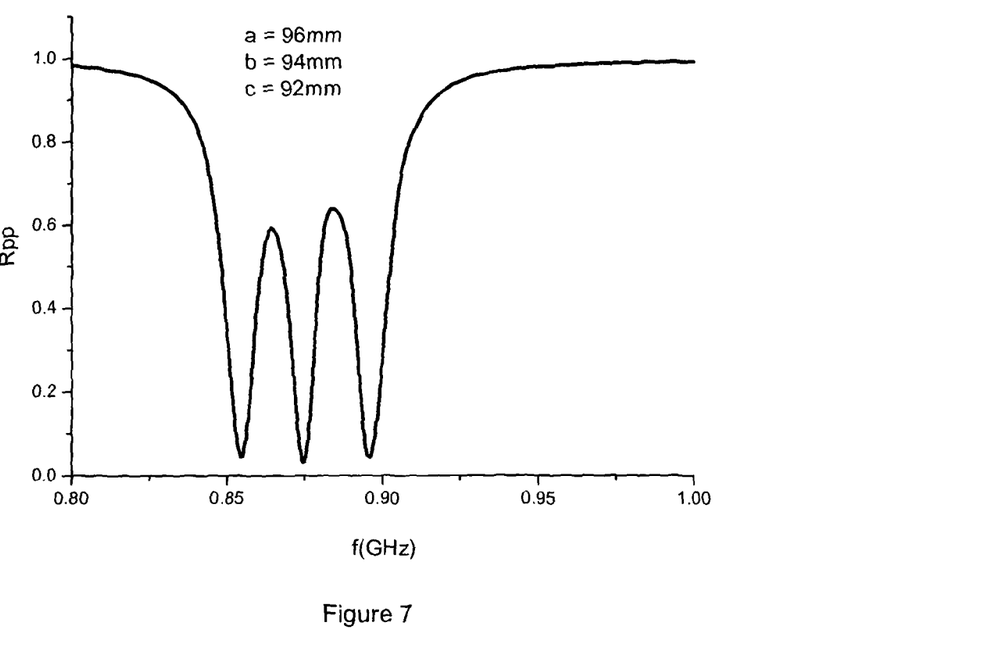

The effect of incrementally changing the length of the individual patches within each stack is further demonstrated by FIG. 7. Here the patch side length of the two top patches is reduced such that a=96 mm, b=94 mm and c=92 mm. Now, resonant frequencies of subsequent patches are closer together, providing a smaller overall band width from approx 850 to 900 MHz, but reducing the reflectance of the 'shoulders' between individual modes and decreasing the reflectance over the resonant bandwidth.

Figure 8:
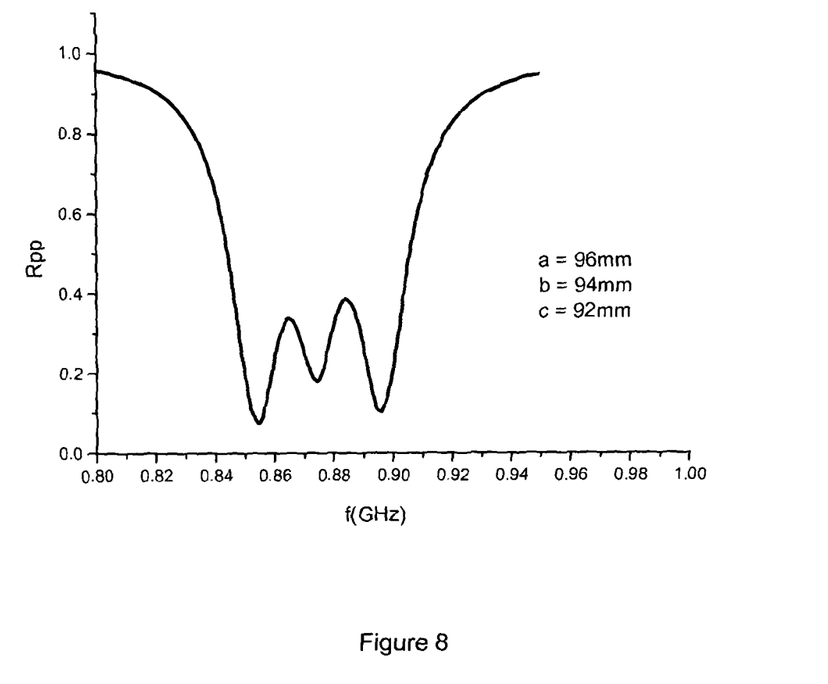
FIG. 8 illustrates the effect of varying dielectric properties.

The complex permittivity of the dielectric spacer may also be varied, as illustrated in FIG. 8. Increasing the imaginary component of the dielectric constant results in a smoothing out of the individual features of the resonant absorption. In FIG. 8 the absorption loss of the polyester layer is increased from $\in=3.2+0.0096i$ to $\in=3.2+0.04i$, which has the effect of further smoothing the bottom of the combined resonant feature. Changes to the complex permeability of the spacer may also tailor the resonance. Such changes in permittivity and permeability can be attained via a variety of processes such as the addition of particulate, flake or fibre inclusions of different materials, voids, or patterned sheets of material of specific material properties within the dielectric core.

It will be understood that the present invention has been described above purely by way of example, and modification of detail can be made within the scope of the invention.

For example, although examples of metals have been provided for conductors, any material that has a metallic response at the electromagnetic wavelengths of interest can be used as a conductor material. The thickness of such a material must be such that it is at least partially opaque to the target wavelengths (this is determined by skin depth calculations which will be known to the skilled person). For example, for microwave applications the conductor layers would generally be of the order of 5 microns and above in thickness It should be noted that that references to wavelength above are to the in vacuo wavelength.

Each feature disclosed in the description, and (where appropriate) the claims and drawings, may be provided independently or in any appropriate combination.

The invention claimed is:

1. An electromagnetic radiation absorber comprising:
a conducting base layer;
a plurality of further layers, including at least a first and a second layer, and all separated from each other with dielectric material;
the first layer including a first array of conducting patches;
the second layer including a second array of conducting patches;
said base layer, first layer and second layer being spaced apart from, and electrically isolated from one another; and
wherein patches of said second layer are stacked on top of patches of said first layer; and each patch is highly conductive, and defines a resonant cavity in cooperation with the conductive patches, or the conductive base layer, below it, and the dielectric material therebetween, and patches of the second array are smaller than patches of the first array wherein a resonant frequency of the cavity is different from a resonant frequency of an adjacent cavity above or below it and the periodicity of the second array is substantially the same as that of the first array.

2. An absorber as claimed in claim 1 wherein a characteristic of patches in the first layer is different to a characteristic of patches in the second layer.

3. An absorber according to claim 1 wherein cavities defined by patches in the second layer resonate at higher frequencies than the cavities defined by patches in the first layer.

4. An absorber according to claim 1, wherein spacing between the base and first layers is arranged to be different to spacing between the first and second layers.

5. An absorber according to claim 1, wherein at least one dielectric or magnetic property of the region defined between the base and the first layer are different from at least one dielectric or magnetic property of the region between the first and second layer.

6. An absorber according to claim 5 wherein the loss factor of the dielectric is the differing property.

7. An absorber according to claim 1, wherein the conducting patches in each array are regularly spaced.

8. An absorber according to claim 1 wherein the conducting patches in each array comprise homogeneous metallic conductors of uniform thickness.

9. An absorber according to claim 1 wherein the conducting patches are made from copper or aluminum.

10. An absorber according to claim 1, wherein patches are circular.

11. An absorber according to claim 1, further comprising a third layer including a third array of conducting patches, spaced apart from and electrically isolated from said second layer.

12. An absorber according to claim 11, wherein patches of the third layer are smaller than patches of the second layer.

13. A method of treating a base conducting surface to impart electromagnetic radiation absorption, said method comprising:

providing one or more multilayer elements, each element comprising a first highly conducting layer and a second highly conducting layer overlying the first layer, said second layer spaced apart from and electrically isolated from said first layer with a dielectric material; and applying said one or more multilayer elements to said base conducting surface such that said first layer is spaced apart from and electrically isolated from said base conducting surface, wherein each multilayer element comprises an array of metallic patches, and in use each patch defines a resonant cavity in cooperation with one or more conductive patches, or the base conductive surface, below it, and the dielectric material therebetween, wherein a metallic patch on the second layer overlies, and is smaller than the one of the first layer, and wherein a resonant frequency of the cavity is different from a resonant frequency of an adjacent cavity above or below it, and further wherein the periodicity of the patches is substantially the same on each layer.

* * * * *